United States Patent [19]

Pruvot

[11] Patent Number: 5,041,890
[45] Date of Patent: Aug. 20, 1991

[54] PRE-PROCESSING WAFER FOR THE OUTPUT CURRENTS OF DETECTION DIODES SUBJECTED TO THERMAL RADIATION

[75] Inventor: Henri G. Pruvot, Paris, France

[73] Assignee: SAT (Societe Anonyme de Telecommunications), Paris, France

[21] Appl. No.: 427,256

[22] Filed: Oct. 25, 1989

[30] Foreign Application Priority Data

Oct. 25, 1988 [FR] France ................. 88 13911

[51] Int. Cl.⁵ .............................. H01L 29/78
[52] U.S. Cl. ................. 357/24; 358/213.19
[58] Field of Search ............ 307/308 A, 311; 357/24 LR; 358/213.19

[56] References Cited

U.S. PATENT DOCUMENTS

| 4,856,033 | 8/1989 | Hirota | 307/311 |
| 4,866,496 | 9/1989 | Audier | 357/24 LR |
| 4,875,101 | 10/1989 | Endo et al. | 358/213.19 |
| 4,908,684 | 3/1990 | Koike et al. | 358/213.19 |
| 4,990,985 | 2/1991 | Kamata | 357/24 LR |

FOREIGN PATENT DOCUMENTS

| 0082616 | 4/1983 | European Pat. Off. |
| 0149948 | 7/1985 | European Pat. Off. |
| 0230809 | 10/1987 | European Pat. Off. |
| 0203076 | 10/1985 | Japan .................... 357/24 LR |

Primary Examiner—David Hudspeth
Assistant Examiner—Andrew Sanders
Attorney, Agent, or Firm—Rosenman & Colin

[57] ABSTRACT

A wafer is provided for pre-processing the output currents of detection diodes subjected to thermal radiation, comprising an input stage for integrating the output currents of the diodes and an output stage delivering a signal related the incident radiation by a transfer function. It also comprises transistors for compressing the transfer function, the transistors conducting beyond a shunt threshold current less than a clipping threshold current and having a conduction resistance such as to shunt only a part of the integrated charges.

13 Claims, 3 Drawing Sheets

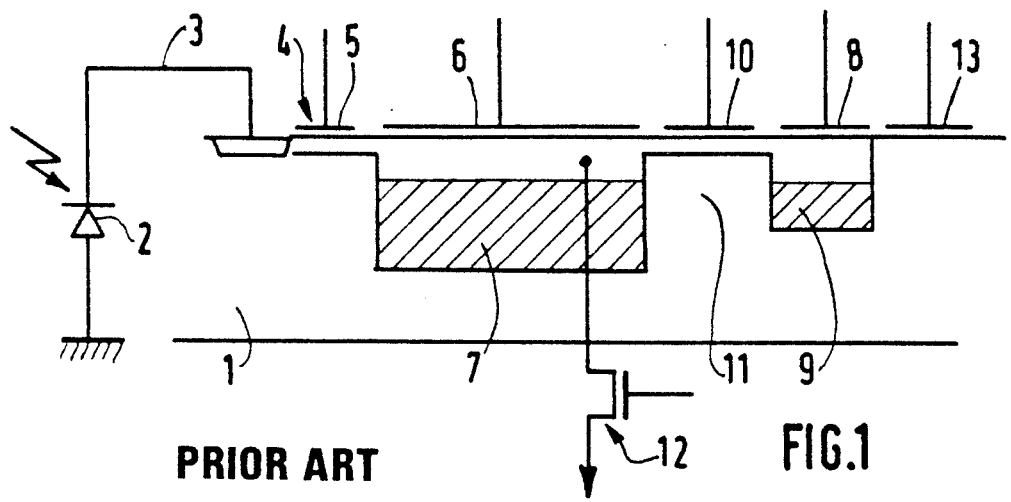
PRIOR ART FIG.1
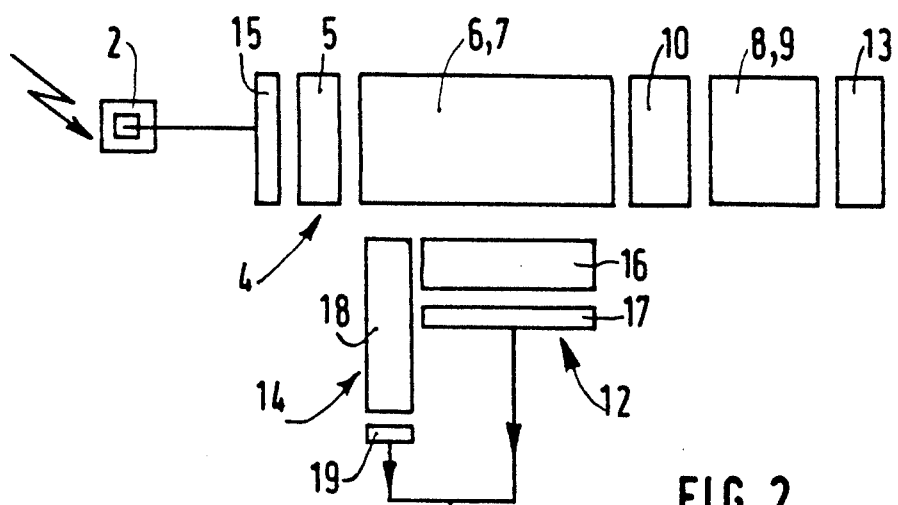
FIG.2
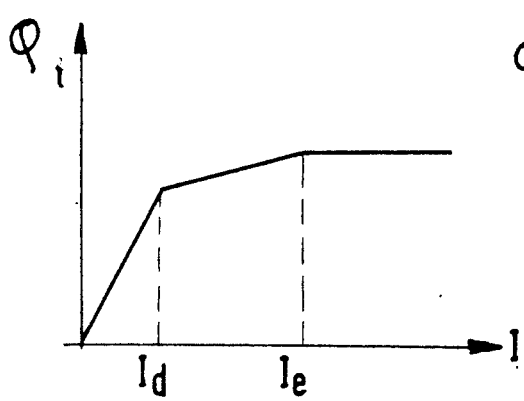
FIG.3
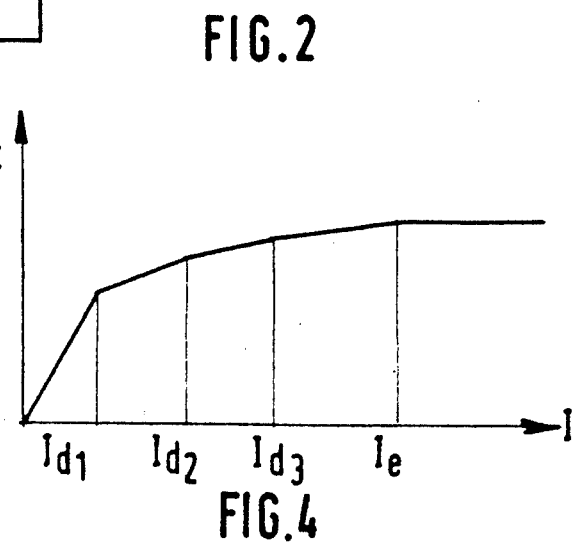
FIG.4

PRE-PROCESSING WAFER FOR THE OUTPUT CURRENTS OF DETECTION DIODES SUBJECTED TO THERMAL RADIATION

BACKGROUND OF THE INVENTION

The present invention originates from the detection used for example in a thermal camera for analyzing landscapes in real time, for example integrated in an imagery or watching system.

1. Field of the Invention

An infrared thermal camera comprises in the first place, in the focal plane of its optical system, a detection wafer containing a mosaic of several hundred even a thousand infrared photodiodes. Considering the high number of diodes, their connection to an external processing circuit by conventional means is excluded. The detection wafer is therefore superimposed and connected to a pre-processing wafer also disposed, or practically so, in the focal plane—the two wafers are thus hybridized—the pre-processing wafer containing charge transfer circuits, namely and essentially input circuits associated with photodiodes for integrating their output currents, pre-amplification filtering and multiplexing devices and an output circuit, also forming an interface between the pre-processing wafer and a separate wafer for subsequent processing. The connections between the wafers may be of the beam-lead type.

To optimize the performances, namely to minimize the parasite noises, the detection wafer must operate at low temperature. The whole of the focal plane formed by the detection and pre-processing wafers is therefore disposed inside a cryogenic enclosure, or cryostat, associated with a cooling system.

For uniform illumination or background, the amounts of charges vary from one line of detectors to another, which contributes to creating the phenomenon of false contrast, or fixed spatial noise, and which deteriorates the quality of the images. This noise in fact originates in the dispersion of the currents delivered by the different detectors because of the variations of cut-off wavelengths,
dark currents,
impedances,
quantum yields and sensitive surfaces of the detectors,
biassing voltages.

To avoid saturation of the processing circuits by this phenomenon and so that the quality of the images obtained is not too deteriorated, a certain dynamics is necessary then with respect to the noise level, to which must be added the dynamics proper to the detection signals which depend on the temperature differences considered.

The scene dynamics to be used in the circuits of the pre-processing wafer is one of the fundamental parameters which govern their design. These dynamics are defined by the ratio between the peak to peak deviation of the signal and the effective noise of the scene background.

Technology however does not allow these dynamics to be extended at will. It is necessarily limited and the result is, besides a limitation of the usable temperature deviation, an inevitable saturation phenomenon. Although, in the field of imagery, saturation of the circuit is not too prejudicial, it is not the same when it is desired to detect objects whose temperature is very much greater than that of the scene background. In the range of saturating temperatures, two hot points of respectively different temperatures cannot however be differentiated.

2. Description of the Prior Art

A wafer is already known, particularly from the documents EP-A-0 082 616 and EP-A-0 149 948, for pre-processing the output currents of detection diodes subjected to thermal radiation, comprising an input stage for integrating the output currents of the diodes, an output stage delivering a signal related to the incident radiation by a transfer function and means for non linearly compressing the transfer function of the wafer.

Non linear compression of the transfer function, which makes its representative curve concave towards the axis of the abscissa, that of the radiation values, of the temperatures or of the current delivered by the detection diode causes, in the curved portion alone of the high signals, compression of the dynamics and, especially, displacement towards the high values of the saturation range, which has undeniably an advantage. The low signals are not affected, the value of the integrated background noise is not affected either, so that the thermal sensitivity is not degraded.

The loss of resolution towards the hot points, due to lowering of the transfer curve with the wafer of the above mentioned documents, is not prejudicial, as long as it is sufficient to detect these hot points with an accuracy of only a few degrees.

It will be noted that compression of the transfer function is distinguished from compression by variation of the integration time. This latter is a linear compression, namely the signal varies proportionally to the integration time whereas the noise varies proportionally to the square root of this time; such linear compression adversely affects the strong and weak signals in the same way and so degrades the thermal sensitivity.

The wafer of the type mentioned above is however not fully satisfactory. That of the document EP-A-0 082 616 for example comprises a cascade of wells which cannot ensure the two clipping and shunt-compression functions, this disadvantage appearing more clearly after introduction of the invention of the present application. Furthermore the notions of skimming of the charges and or removing the skimmed charges are also totally absent. As for the wafer of document EP-A-0 149 948, with its additional storage means controlled by variable biassing voltages, it has the same drawbacks as the preceding ones.

SUMMARY OF THE INVENTION

The present invention aims then at improving the wafers of the above mentioned type.

For this, the present invention relates to a wafer of this type, characterized by the fact that the input stage comprises, for each diode, means for integrating the output current of the diode delivering an amount of integrated charges and a means for skimming the integrated charges, removing the skimmed charges and shunting the integrated charges beyond a clipping current threshold, and the compression means which comprise the transfer function of the input stage comprise a means adapted for becoming conducting, beyond a shunt threshold current lower than the clipping threshold current, and having a conduction resistance such as to shunt only a part of the integrated charges.

Since it is the transfer function of the input stage of the wafer which is compressed, the dynamics constraints are reduced as much as possible since the compression takes place the closest to the detection diodes.

Furthermore, the function of shunting integrated charges in the wafer of the invention is split up:beyond the conduction threshold of the shunting means, a part of the integrated charges is shunted whereas the skimming and shunting means shunt all the integrated charges beyond the clipping threshold.

Preferably, a plurality of parallel shunting means are provided, adapted so as to become conducting, beyond respectively increasing shunt threshold currents, with respectively decreasing conduction resistances.

Alternately, the shunting means may be adapted to be driven by the output current of the diode and have a conduction resistance increasing with the output current of the diode.

In this case, a clamping device may be provided for overcoming the static characteristics of the diodes.

In the preferred embodiment of the invention, the preprocessing wafer is disposed in a cryogenic enclosure.

Preferably again, the input stage comprises for each diode, an FET transistor with MOS structure, integrated on a substrate for integration of the output current of the diode and skimming the integrated charges, an FET removal and clipping transistor whose source is formed by the drain of the integration and skimming transistor and an FET transistor for removing the integrated charges.

BRIEF DESCRIPTION OF THE DRAWINGS

The invention will be better understood from the following description of several embodiments, with reference to the accompanying drawings in which:

FIG. 1 shows schematically, in section, the input stage of a pre-processing wafer of the prior art;

FIG. 2 shows schematically, in a top view, a first embodiment of the input stage of the pre-processing wafer of the invention;

FIG. 3 shows the compressed curve of the transfer function of the input stage of FIG. 2;

FIG. 4 shows the compressed curve of the transfer function of the input stage of a second embodiment of the wafer of the invention;

DESCRIPTION OF THE PREFERRED EMBODIMENTS

Figure 5:
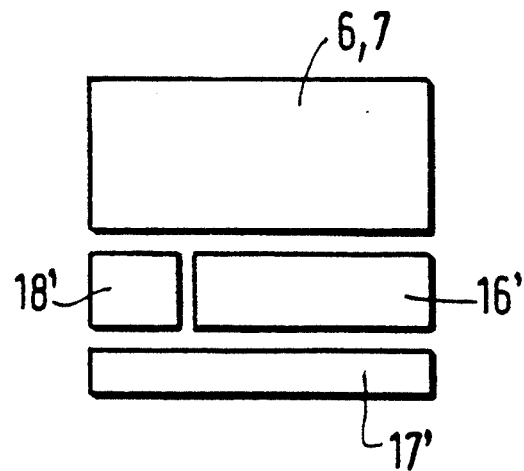
FIG. 5 shows schematically in a top view the shunt transistor comprising two gates of the input stage of a third embodiment of the wafer of the invention.

Let us consider first of all a pre-processing wafer of IR-CCD type, of the prior art, coupling an infrared detection photodiode wafer to an external processing circuit, the two detection and pre-processing circuits being disposed in the focal plane of an optical system and here inside a cryogenic enclosure.

The pre-processing wafer comprises as many input circuits, as will now be described with reference to FIG. 1, as there are detection diodes integrated on a substrate 1 here made from silicon.

Let 2 be an infrared diode of the detection wafer, which operates reversely and whose cathode forms the source 3 of an FET MOS structure transistor 4, forming the input stage of the pre-processing circuit with direct injection. The biassing gate of transistor 4 is shown at 5. A plate 6 at a storage potential creates, in substrate 1, a first storage well 7 forming the drain of transistor 4. The drain 7 of transistor 4 forms the source of a second FET transistor 12, called removal and anti-blooming transistor. On the other side of the storage plate 6, with respect to gate 5 of transistor 4, is disposed a plate 8, at a given potential for creating, thereunder, a second storage well 9. A plate 10, at a transfer potential controlled by a clock with variable cyclic ratio t/T, between plates 6 and 8, above a space 11 in the substrate 1, makes possible the transfer of charges from the first well 7 into the second well 9, by creating a space charge reuniting the two wells 7 and 9. This plate 10 provides a switching function.

The output current of diode 2 is therefore processed in the above described circuit, which delivers a charge signal. More precisely, the current of the diode is integrated and transformed into an amount of charges during the integration time t defined by the clock controlling the potential of switch 10. In other terms, the photocurrent of diode 2 is integrated for a time t and the above described circuit carries out a current/charge conversion before, at the end of each period T of the control clock, transferring the charges from the second well 9 into a delay line (CCD) for subsequent processing, by applying voltages, offset in time, to a series of transfer gates 13. Generally, the integration time t is very much less than the period T.

It will be noted that the charges of the second well 9 could also be directly transferred into a charge/voltage converter.

All the charges integrated in the first well 7, corresponding to the current delivered by diode 2, do not have to be transferred into line CCD, the others being removed. The amount of integrated charges is then skimmed, this skimming function being provided by the second well 9 and the removal function by transistor 12.

It may also happen that it is not necessary to transfer into the line CCD all the charges integrated in the first well 7, still corresponding to the current delivered by diode 2, these charges having to be removed. It is again transistor 12 which plays this role within its antiblooming or shunt function.

The method of reducing the integration time apart, these base-chopping, removal and anti-blooming functions will now be analyzed.

Skimming

The purpose of skimming is not to transfer the charges of the minimum current of the diode which is likened to that corresponding to the average scene background and so without meaning.

Skimming may be carried out with partition; it may be achieved by overflow.

A first method consists, during the integration time t, in reuniting the two wells 7 and 9 under the action of gate 10 and integrating the current for converting it into a charge amount $Q_i$, before, during a partition pulse, isolating these two wells, transferring into line CCD the amount $Q_t$ of charges from the second well 9 and, by applying to the gate of transistor 12 a high conduction potential, removing the skimmed charge $Q_t$ from the first well 7. The amounts of integrated charge $Q_i$, skimmed charge $Q_e$ and transferred charge $Q_t$ are related by the formula:

$$Q_t = \alpha(Q_i - Q_e)$$

$\alpha$ being the partition coefficient.

The surface of gate 10 being small with respect to that of gates 6 and 8, the partition coefficient $\alpha$ depends on the surfaces $S_6$ and $S_8$ of these gates and is given by the formula:

$$\alpha = \frac{S_8}{S_6 + S_8}$$

If gates 6 and 8 are at the same potential but if their respective surfaces are different, namely if $\alpha$ is different from 1, limitation of the amount of charges transferred may be obtained by partition alone.

A second method, called overflow, consists, during an integration time t, in integrating the current and converting it into a charge amount in the first well 7 before, during a skimming pulse, and under the action of gate 10, causing the first well 7 to overflow into the second well 9 then, during a removal pulse, causing the remaining charges from the first well 7 to be removed by transistor 12.

It will be noted that during the skimming and removal pulses, the integrated charge amounts in the first well 7 are negligible.

It will again be noted, generally, that the charges to be transferred into line CCD must be in the second well 9 before transistor 12 is enabled.

Anti-blooming

The purpose of anti-blooming is to shunt all the diode current when it is too high and to prevent a saturating current from adversely affecting the operation particularly of the above described input stage and of the circuits of the processing wafer. The anti-blooming function is therefore provided by transistor 12 acting as a clipping shunt.

In actual fact, a low conduction potential is applied permanently to the gate of transistor 12. It is insufficient to enable it when diode 2 delivers a normal current, but sufficient when it is a saturating current.

In this case, when wells 7 and 9 are not reunited, the current is integrated in the first well 7 but the charges overflow directly into transistor 12 without being transferred into the second well 9. If the two wells 7 and 9 are reunited, it is the charges of the two reunited wells which again overflow into transistor 12 which continues to play its shunt role.

During the progress of the anti-blooming function, the integration cycles are allowed to pass.

To sum up, as long as the diode current enables transistor 12, with its gate potential at a low level, it plays its anti-blooming and shunting role and removes the charges which are integrated but not stored in the second well 9, if not, and with its gate potential at a high level, it plays its role of removing the skimmed charges from the first well 7 after integration and storage, in the second well 9, of the charges to be transferred.

The pre-processing wafer of the invention is identical to that which has just been described, except for the device for removing and shunting the integrated charges.

In a first embodiment, illustrated schematically in a plan view in FIG. 2, and the same elements bearing the same reference numbers, the removal and shunt device comprises two parallel FET transistors, transistor 14 providing a first part of the shunt function and transistor 12, that of the wafer of FIG. 1, providing a second part of the shunt function and the function of removing the amount of skimmed charges. The source of the two transistors 12 and 14 is formed by the drain of transistor 4.

At 15 has been shown the input diffusion zone on substrate 1, namely the source of the input transistor 4, at 16 the biassing gate of transistor 12, at 17 its drain or input diffusion zone, at 18 the biassing gate of transistor 14, at 19 its drain or output diffusion zone, connected to the same biassing source as drain 17 of transistor 12, the source of transistors 12, 14 being formed by the drain of transistor 4.

The geometries of the two shunt transistors 14 and 12, particularly those of their gates respectively 18, 16, are such that, with respect to the dimensions of the channel of transistor 12 subjected to the action of gate 16, the channel of transistor 14, subjected to the action of gate 18, has a small width and a great length. Thus, the conduction resistance of transistor 14 is greater than that of transistor 12. In other words, since the potential of the gate 18 of transistor 14 is always at a low level, the source-drain resistance of transistor 14, when the potential of gate 16 of transistor 12 is at a high level, namely when transistor 12 "conducts" and provides its function of removing the skimmed charges, is much greater than that of transistor 12; for the removal function, transistor 14 is short-circuited.

When transistor 12 is not "conducting", namely during integration of the diode current, the resistance of transistor 14, while remaining high, is naturally lower than that, practically infinite, of transistor 12. As for the transistor 12, whose operation has been described above, beyond a certain threshold current $I_d$, it being recalled that a biassing potential is always applied to gate 18, transistor 14 is enabled and shunts the current. But since its resistance remains always relatively high, it only shunts a fraction thereof; it does not behave like transistor 12, whose resistance is relatively lower, which, in its shunt function, beyond a threshold current $I_e$ of a value higher than $I_d$ acts as a shunt for shunting all the integrated current. The transistor 12 clips, whereas transistor 14 shunts or compresses.

The dynamics compression obtained with transistor 14 is illustrated in FIG. 3, representing the curve of the transferred charges amount $Q_t$ as a function of the current I of the detection diode 2, namely the curve of the transfer function of the input stage of the pre-processing wafer. It is a single plateau compression extending from the conduction threshold $I_d$ of the shunt transistor 14 as far as the clipping or anti-blooming threshold of transistor 12.

In other embodiments, other shunt transistors can be added to the preceding shunt transistor 14 and a plurality thereof integrated in parallel, with respective conduction thresholds which increase and respective conduction resistances which decrease, so as to obtain better compression transfer curves, better curved, such as that shown in FIG. 4, with several plateaus $Id_1$, $Id_2$, $Id_3$.
. . .

The two transistors 12 and 14 have a common source 6, 7. Two shunt and shunt-removal transistors could also be contemplated having not only a common source 6, 7 but also a common drain 17', so as to form in fact a single transistor with two gates 16' and 18' (FIG. 5). The width of the channel subjected to the action of gate 18' would remain small with respect to that of the channel subjected to the action of gate 16', but the two channels would have the same length. Such a solution, without being fully satisfactory for this reason, would nevertheless be interesting from the compression point of view.

Figure 6:
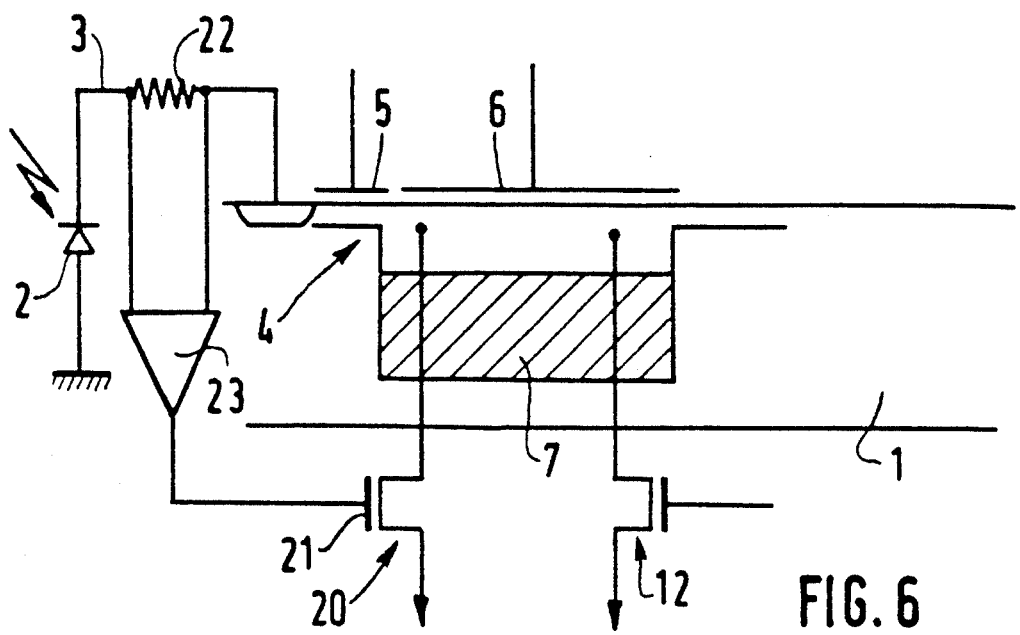
FIG. 6 shows the input stage of a fourth embodiment of the wafer of the invention.

In another embodiment, illustrated in FIG. 6, the shunt function is always split up and provided respectively by an FET transistor 20 and transistor 12 in parallel, but transistor 20 operates as a controlled resistance. Its source is formed by drain 7 of transistor 4 and its gate 21 is driven by the current from the detection diode 2, seized by a resistor 22, in series between the cathode of diode 2, and the source of transistor 4, and amplified by amplifier 23, across the terminals of resistor 22 and whose output is connected to gate 21 of transistor 20.

Figure 7:
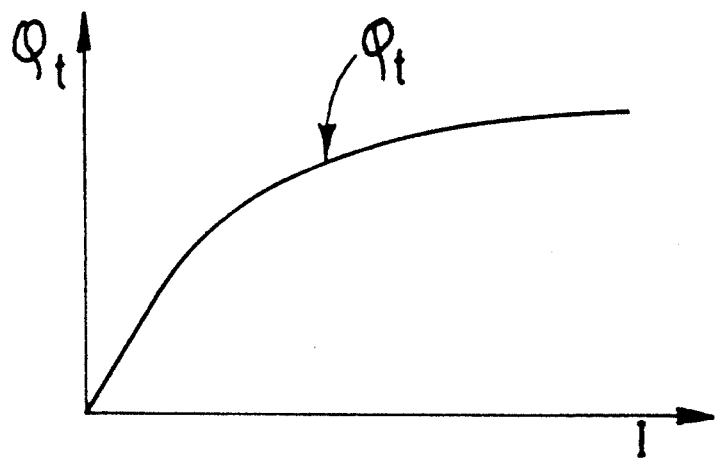
FIG. 7 shows the compressed curve of the transfer function of the stage of FIG. 6.

The value of the drain-source resistance of transistor 20 depends on the voltage applied to its gate 21. The more it increases, because the diode current increases, the more the resistance decreases and the higher the shunt effect. Thus a curved compression curve is obtained, concave towards the axis of the abscissa (FIG. 7).

It will be noted that since the control of transistor 20 is slaved to the value of the photocurrent, the weak signals are not affected and since the resistance of transistor 20 decreases exponentially with the gate voltage, the compression effect is all the more accentuated for strong signals. In a variant (FIG. 8) of the wafer of FIG. 6, source 25 of the first shunt transistor 24 is connected directly to the source of transistor 4 but upstream of the topography implanted on substrate 1, and to the downstream terminal of a resistor 27, in series with diode 2, control of the gate 26 of transistor 24 remaining unchanged and being provided by the photocurrent measured by resistor 27 and amplified by an amplifier 28.

Figure 8:
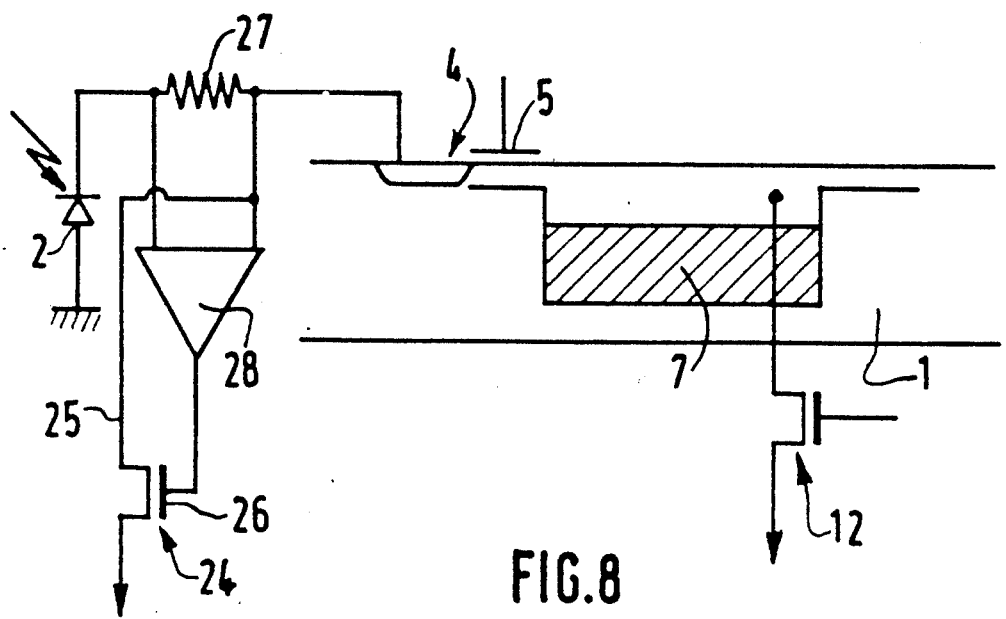
FIG. 8 shows the input stage of a fifth embodiment of the wafer of the invention.

The arrangement of FIG. 2, from a compression point of view, is a little less satisfactory than those of FIGS. 6 and 8. On the other hand, it offers the advantage of a higher degree of integration and is therefore advantageous in the case of a detection wafer comprising numerous diodes.

The arrangements of FIGS. 6 and 8 apply not only to wafers of type IR-CCD but also to wafers of other types, such for example as CMOS circuits associated with $I_nS_b$ detectors, for which the use of a delay line CCD is practically impossible.

Because of the dispersion of the static characteristics of the detection diodes, non linear transfer functions of the input stages may raise a small problem, particularly in the case of the arrangement of FIG. 2. In fact, a dispersion of the rest points, defined by the intersections of the voltage-current curves of the diodes, on the one hand, and of the pseudo MOS transistors 4 which bias these diodes respectively, on the other hand, means that different tripping thresholds are assigned to the shunt transistors 14.

In the case of the arrangements of FIGS. 6 and 8, it is much easier to add a clamping device to the amplifier 23, 28 measuring the photocurrent.

Figure 9:
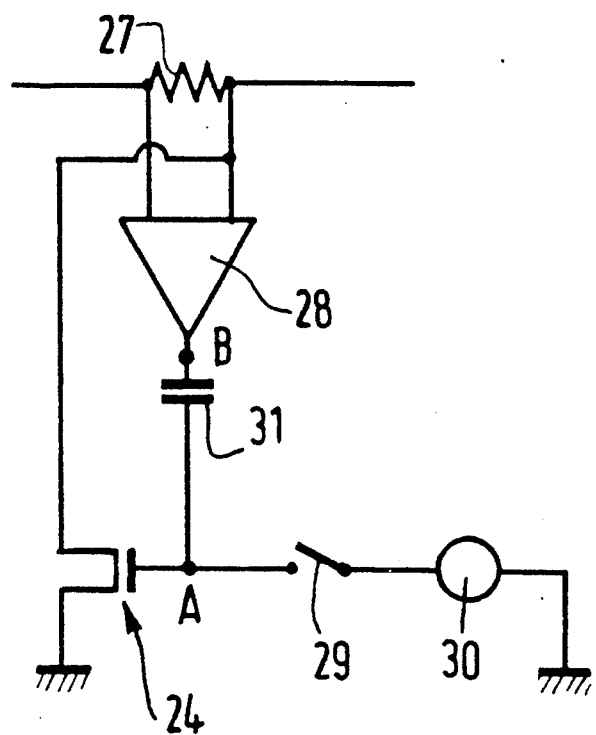
FIG. 9 shows the shunt transistor of the input stage of FIG. 8, with a clamping device.

Referring to FIG. 9, which illustrates the modification made on the arrangement of FIG. 8, but the arrangement to be made to that of FIG. 6 would be equivalent, the clamping device comprises a capacitor 31 connected both to the amplifier 28 and to the base of transistor 24 and to one of the terminals of a switch 29, whose other terminal is connected to a reference voltage $V_{ref}$ generator 30 common to all the clamping devices of all the input stages.

During each scanning return, the uniform reference background is shown to all the diodes, at a given temperature. During these scanning returns, switch 29 is closed which fixes the potential $V_A$ of point A, between the base of transistor 24 and capacitor 31, to $V_{ref}$. During these scanning returns, the potential difference $V_A - V_B$ at the terminals of capacitor 31, $V_f$ being the voltage at the output B of amplifier 28 and which depends on the static characteristics of the diode considered, amounts to $$V_A - V_B = V_{ref} - V_f$$

Following scanning of a line of the image to be analyzed, during which switch 29 is open, the potential $V_B'$ of terminal B of capacitor 31 connected to amplifier 28 being $V_f + \Delta V$, the potential $V'_A$ of terminal A of capacitor 31 and so of the gate of transistor 24 becomes:

$$V_A'e = (V_A - V_B) + V_B' = V_{ref} - V_f + V_f + V_f + \Delta V = V_{ref} + \Delta V$$

Thus, capacitor 31, during the phase of the scanning return, has stored the value of the current corresponding to the reference background and, during the scanning phase, it is no longer the total value of the current which is taken into account but the deviation of the current with respect to that of the rest point. The static characteristics of the diodes which affect the reference levels have thus been overcome.

Finally, it will be noted that a non linear device integrated in the focal plane makes it possible to use a coding chain with lesser dynamics, so much easier to implement, less costly and of lower dissipation.

What is claimed is:

1. A device for pre-processing output currents generated by radiation detectors, comprising for each detector:
    (a) a charge injection source operatively connected to a respective detector, for supplying a quantity of charge representative of the output current generated by the respective detector;
    (b) charge accumulator means operatively connected to the charge injection source, for accumulating the charge supplied by the source over an integration time period in an evacuation well and in a separate output well;
    (c) means for separating the evacuation well from the output well to control the amount of the charge accumulated in each well;
    (d) evacuation means operatively connected to the evacuation well, for evacuating the charge accumulated in the evacuation well;
    (e) transfer means operatively connected to the output well, for transferring the charge accumulated in the output well; and
    (f) control means for controlling the rate of the charge transferred from the output well as a function of the magnitude of the output current generated by the respective detector, by decreasing said rate as the magnitude of the output current increases.

2. The device according to claim 1, wherein the evacuation means is operative for removing all of the charge accumulated in the evacuation well above a predetermined first threshold of the output current; and wherein the control means is operative, together with the evacuation means, for removing a part of the charge accumulated in the evacuation well above a given second threshold of the output current, said second threshold being less than said first threshold.

3. The device according to claim 2, wherein the evacuation means is a field effect transistor having a source, a gate and a drain; and wherein the control means is a field effect transistor having a source, a gate and a drain; and wherein the transistors are electrically connected in parallel across the evacuation well.

4. The device according to claim 3, wherein the source of each transistor is a common source.

5. The device according to claim 3, wherein the drain of each transistor is a common drain.

6. The device according to claim 3, wherein the transistor of the control means has a greater conduction resistance than the transistor of the evacuation means.

7. The device according to claim 2, wherein the control means is operative, together with the evacuation means, for removing different parts of the charge accumulated in the evacuation well above a plurality of auxiliary thresholds of the output current, said thresholds increasing in magnitude from the first to the second threshold.

8. The device according to claim 1, wherein the control means continuously decreases said rate as the magnitude of the output current increases.

9. The device according to claim 8, wherein the control means is a field effect transistor having a source, a gate, a drain, and a drain-source resistance whose value is dependent on the magnitude of the output current.

10. The device according to claim 9, wherein the control means includes a resistor electrically connected in series between the respective detector and the charge injection source; and an amplifier having input terminals electrically connected in parallel across the resistor, and operative for generating an amplified signal at an output terminal connected to the gate of the transistor.

11. The device according to claim 18, wherein the source of the transistor is connected to the evacuation well.

12. The device according to claim 10, wherein the source of the transistor is connected to a junction between the resistor and one of the input terminals of the transistor.

13. The device according to claim 12, wherein the control means further includes a capacitor electrically connected in series between the output of the amplifier and the gate of the transistor; and a reference voltage generator and a switch electrically connected in series between the gate and ground.

* * * * *